(12) United States Patent
Leroux (10) Patent No.: US 7,067,931 B1
(45) Date of Patent: Jun. 27, 2006

(54) SELF-COMPENSATING MARK DESIGN FOR STEPPER ALIGNMENT

(75) Inventor: Pierre Leroux, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 168 days.

(21) Appl. No.: 09/737,606

(22) Filed: Dec. 14, 2000

(51) Int. Cl.
*H01L 23/544* (2006.01)

(52) U.S. Cl. ...................... 257/797; 257/620
(58) Field of Classification Search ............... 257/620, 257/797, 975; 438/401, 462
See application file for complete search history.

(56) References Cited

U.S. PATENT DOCUMENTS

| 4,849,313 | A | | 7/1989 | Chapman et al. |
| 5,250,983 | A | | 10/1993 | Yamamura |
| 5,414,514 | A | | 5/1995 | Smith et al. |
| 5,777,392 | A | | 7/1998 | Fujii |
| 6,071,656 | A | | 6/2000 | Lin |
| 6,151,120 | A | | 11/2000 | Matsumoto et al. |
| 6,172,409 | B1 | * | 1/2001 | Zhou .......................... 257/620 |

FOREIGN PATENT DOCUMENTS

EP  0715215  6/1996

OTHER PUBLICATIONS

Danny Banks, "Introduction to Microengineering," Demon Co., England, (1999) pp. 2-3.*
Ultratech Stepper, Ultratech Model 1000 Stepper Poduct Sheet (2000).*
Stanley Wolf and Richard N. Tauber, Silicon Processing for the VLSI Era, vol. 1, Lattice Press, Sunset Beach, CA. (1986) p.478.*

* cited by examiner

*Primary Examiner*—Nitin Parekh
(74) *Attorney, Agent, or Firm*—Peter Zawilski (57) ABSTRACT

A system and method for fabricating integrated circuits using four fine alignment targets per stepper shot. The four alignment targets are disposed within the scribe line on each side of a four-sided stepper shot. The targets on opposites sides of the region are located in mirror-image positions. For example, in a square or rectangular region, the targets could be at the mid-point of each side, or at each corner. Because the scribe lines for adjoining stepper shots overlap, a target in one shot will overlay a target from a preceding shot. In a positive resist process, for example, the target resulting from the overlay will be reduced in size by an amount corresponding to the amount of rotational error, if any. However, the target will still indicate the center of the stepper shot, thereby compensating for the rotational error with no further measurements.

7 Claims, 13 Drawing Sheets

SELF-COMPENSATING MARK DESIGN FOR STEPPER ALIGNMENT

TECHNICAL FIELD

The present invention relates to the fabrication of integrated circuits on wafers in a stepper. More specifically, the present invention pertains to an arrangement of fine alignment targets used for aligning a stepper shot and a wafer.

BACKGROUND ART

Integrated circuit dies are fabricated en masse on silicon wafers using well-known techniques such as photolithography. Using these techniques, a pattern that defines the size and shape of the components and interconnects within a given layer of the integrated circuit die is applied to the wafer. The pattern applied to the wafer is laid out in an array, or matrix, of reticle images. A wafer stepper holds the pattern over a wafer and projects the pattern image of the reticle onto the wafer through a lens. The area on the wafer upon which the image is projected is defined as a stepper shot.

Figure 1:
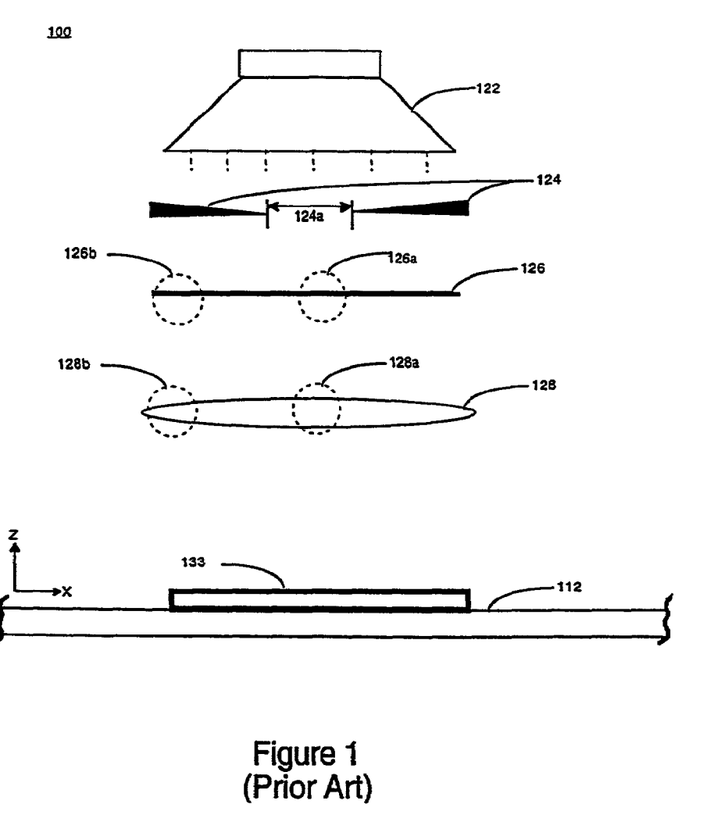
FIG. 1 is a side view of one embodiment of a stepper in accordance with the present invention.

Referring now to prior art FIG. 1A, a side view of a stepper 100 is shown. Stepper 100 includes a light source 122, masking blades 124, a reticle 126, a lens 128, and a stage 112. The light source 122 projects light through an opening 126a of masking blades 124, through the transparent portion of a pattern 126a on reticle 126, through lens 128 and onto a wafer 133 located on the stage 112. By doing so, the pattern 126a of the reticle 126 is reproduced on the wafer 133, typically at a 5:1 reduction. A pattern located on an inner, or center, portion of the reticle 126 passes through a center portion 128a of lens 128. Similarly, a pattern 126b located on an outer, or peripheral, portion of the reticle 126 passes through an outer portion 128b of lens 128.

The integrated circuit is essentially built-up by forming on the wafer 133 a multitude of interconnecting layers, one layer on top of another. Because the layers interconnect, a need arises for ensuring that the patterns on wafer 133 are accurately positioned and formed. Conventional methods rely on precise alignment of the wafer 133, the stage 112, the lens 128 and the reticle 126 in order to accurately fabricate an integrated circuit.

Accurate formation of an image on a wafer using photolithography can be affected by several error-causing variables. These variables include rotational alignment error, translational alignment error, and lens distortion error, among others. Each one of these error-causing variables can be corrected by a different part of the stepper. It is desirable to segregate the types of errors and measure them independently so that the error measurements are not confounded and so that the resulting corrections for each variable will not be conflicting and counterproductive.

The rotational alignment error, caused by rotational movement of the reticle 126 relative to the wafer 133 (or vice versa), is of particular interest with regard to the discussion herein. As described above, it is desirable to segregate rotational error from the other error-causing variables in order to compensate for the true measurement of rotational error.

Figure 2A:
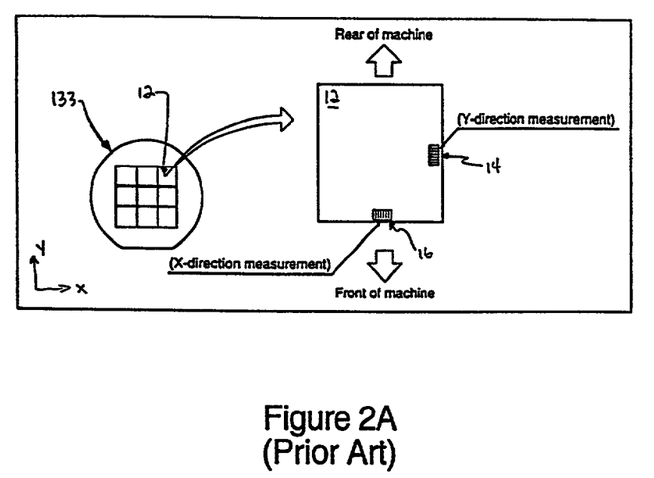
FIGS. 2A and 2B show arrangements of alignment targets according to the prior art.

With reference now to Prior Art FIG. 2A, alignment targets 14 and 16 are placed on the wafer 133 in order to ensure that the final alignment of the wafer 133 and the reticle 126 (FIG. 1) is correct before the integrated circuit is formed. The alignment targets 14 and 16 are located within the scribe line region of a stepper shot 12. A stepper shot 12 may be comprised of multiple integrated circuit dies or a single die. Multiple stepper shots are performed until the entire wafer 133 is exposed.

Prior Art FIG. 2A illustrates an arrangement using only two alignment targets 14 and 16. Alignment target 14 is used for acquiring the y-direction offset, and alignment target 16 is used for acquiring the x-direction offset. In the prior art, a deviation of the alignment targets 14 and 16 from their expected location or orientation (as defined in the controlling software) is interpreted as a translational error when, in actuality, it may be a rotational error or a lens distortion error.

Figure 2B:
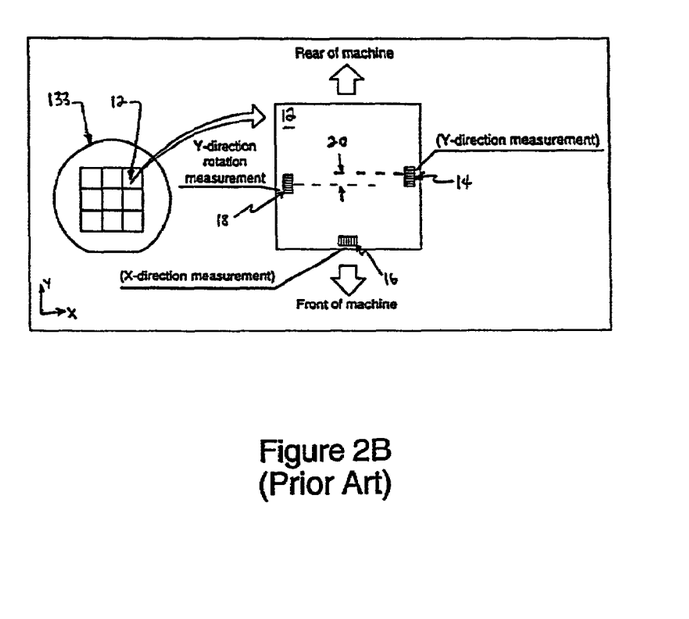

In order to perform a measurement of rotational error in the prior art, an additional alignment target 18 is required as shown by Prior Art FIG. 2B. Prior art design guides specify that alignment target 18 must be placed in a location where it will not interfere with the y-direction measurement mark (e.g., alignment target 14) on the y-coordinate. Consequently, alignment target 14 and alignment target 18 are not aligned with each other and are separated in the y-direction by an offset 20. The amount of offset 20 is measured to determine the amount of rotational error. That is, for example, the amount of offset 20 is known for the case where there is no rotational error. If stepper shot 12 is rotated clockwise, the amount of offset 20 will increase relative to this amount, and the amount of the increase can be translated to a measurement of rotational error.

Thus, to determine the amount of rotational error in the prior art, all three alignment targets 14, 16 and 18 need to be acquired and the deviation from their expected positional values measured. In some stepper implementations, the targets are acquired for multiple shots in order to obtain the measurements needed to determine rotational error. Accordingly, the alignment targets 14, 16 and 18 may need to be acquired and measured multiple times per wafer. The time and the processing effort needed to acquire the targets, obtain measurements, and calculate rotational error can limit the throughput of the stepper.

Furthermore, proper focusing of the alignment scope used to acquire targets 14, 16 and 18 is required in order to acquire the targets with the precision necessary for calculating rotational error. This focusing may be performed for every wafer or at some other frequency (e.g., every other wafer, every fifth wafer, etc.). At any rate, the time needed to complete the focusing task can further limit the throughput of the stepper.

Accordingly, what is needed is a method and/or system that can properly compensate for rotational error in the integrated circuit fabrication process. What is also needed is a method and/or system that can satisfy the above need and that can save measurement and processing time, thereby potentially improving stepper throughput. The present invention provides a novel solution to the above needs.

DISCLOSURE OF THE INVENTION

The present invention provides a method and system thereof that can properly compensate for rotational error in the integrated circuit fabrication process. The present invention also provides a method and system that can satisfy the above need and that can save measurement and processing time, thereby potentially improving stepper throughput.

The present embodiment of the present invention pertains to a method and system thereof for fabricating integrated circuits using four fine alignment targets per stepper shot. In one embodiment, the present invention pertains to a wafer that has four fine alignment targets per stepper shot. In another embodiment, the present invention pertains to a reticle used to form the four alignment targets on the wafer.

The four alignment targets are formed within the scribe line on each side of a four-sided stepper shot. In accordance with the present invention, the alignment targets on opposites sides of the stepper shot are located in mirror-image positions. In one embodiment, for a square or rectangular stepper shot, the alignment targets are located at the midpoint of each side of the stepper shot. In another embodiment, the alignment targets are located at each corner of the stepper shot.

In one embodiment, the alignment targets each include a plurality of rectangles that have prescribed dimensions (e.g., length and width). In one embodiment, the alignment targets are formed using a positive resist process and thus will consist of solid (e.g., chrome) rectangles in a clear field. In another embodiment, the alignment targets are formed using a negative resist process and thus will consist of a dark field (e.g., chrome) background with rectangular windows (e.g., non-chrome regions) formed therein.

Because the scribe lines for adjoining stepper shots overlap, a second alignment target formed in one shot will overlay a first alignment target formed in a preceding shot (e.g., a right-hand target in a first stepper shot will be overlaid by the left-hand target in the adjoining stepper shot). With no rotational error (no rotation of the stepper shot relative to the wafer), the first and second targets will be aligned, and the rectangles that make up the alignment target will retain their prescribed dimensions.

On the other hand, with the stepper shot rotated relative to the wafer, the first and second alignment targets in adjoining stepper shots will not be aligned, and the dimensions of the rectangles that make up targets will change by an amount corresponding to the amount of rotation. That is, with solid rectangles in a clear field, the width of the rectangles will be reduced by an amount corresponding to the amount of rotational error, and with clear rectangles in a dark field, the width of the rectangles will be increased by an amount corresponding to the amount of rotational error.

Nevertheless, in accordance with the present invention, for the case in which the stepper shot is rotated about its center relative to the wafer (or vice versa), the center line of the rectangles, and hence the alignment target, will remain unchanged even with the rotation, thereby compensating for the rotational error without the need for measurement. Thus, the effect of the rotational error is, in essence, canceled out by the placement of the four alignment targets in accordance with the present invention.

For the case in which the stepper shot is rotated about the center of one of its sides (e.g., about the left-center of the shot), the rotational error is reduced by one-half. Thus, in accordance with the present invention, the rotational error for this latter case is minimized and will therefore consume a smaller portion of the budget overlay requirement.

Thus, in accordance with the present invention, the alignment target resulting from the overlay of alignment targets in adjoining stepper shots will compensate for rotation about the center of a stepper shot. Consequently, it is not necessary to acquire the alignment targets in order to determine rotational error, saving time and reducing processing and thereby potentially increasing stepper throughput. In addition, because the alignment approach of the present invention uses four alignment targets per stepper shot, the precision of the fabrication process can be increased relative to conventional approaches.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

PRIOR ART

PRIOR ART

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of procedures, logic blocks, processing, and other symbolic representations of operations for fabricating integrated circuits on a wafer. These descriptions and representations are the means used by those skilled in the art of wafer fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system to fabricate an integrated circuit.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "receiving," "performing," "forming," "overlaying," or the like, refer to actions and processes (e.g., process 700 of FIG. 7) of integrated circuit fabrication.

Figure 3:
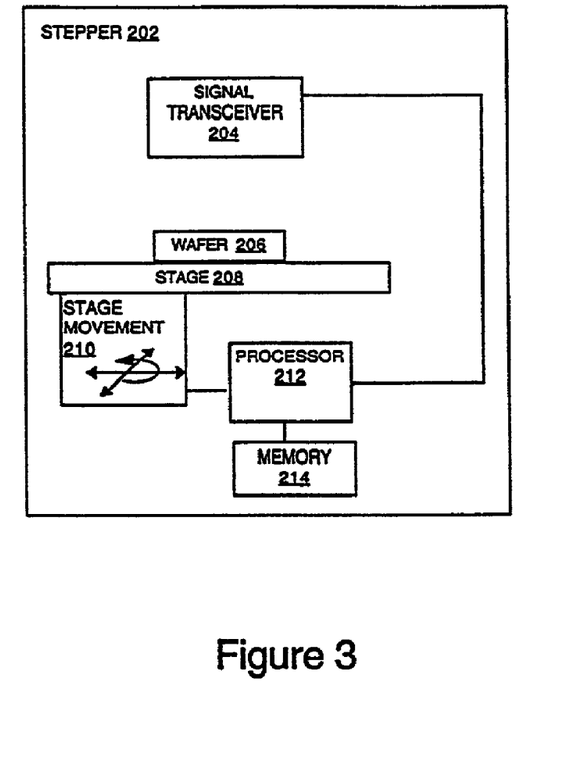
FIG. 3 is a block diagram of one embodiment of a stepper in accordance with the present invention.

Refer now to FIG. 3, which shows a block diagram of a stepper 202 in accordance with one embodiment of the present invention. Stepper 202 includes a stage 208 coupled to a stage movement device 210, a processor 212, a signal transceiver 204, and a memory 214. Wafer 206 is placed on stage 208 for processing in stepper 202.

Memory 214 contains program instructions implemented through processor 212. Memory 214 can either be permanent memory, such as read only memory (ROM), or temporary memory, such as random access memory (RAM). Memory 214 can also be any other type of memory storage capable of containing program instructions, such as a hard drive, a CD ROM, or flash memory. Processor 212 can either be an existing system processor or microprocessor, a dedicated digital signal processing (DSP) processor unit, or a dedicated controller or microcontroller. Alternatively, the program instructions may be implemented using an implementation of a state machine.

Signal transceiver 204 is coupled to processor 212. Signal transceiver 204 is a source of an electromagnetic signal, such as a laser. Additionally, signal transceiver 204 is a receiver for an electromagnetic signal, such as the return signal that is reflected from wafer 206.

Figure 4A:
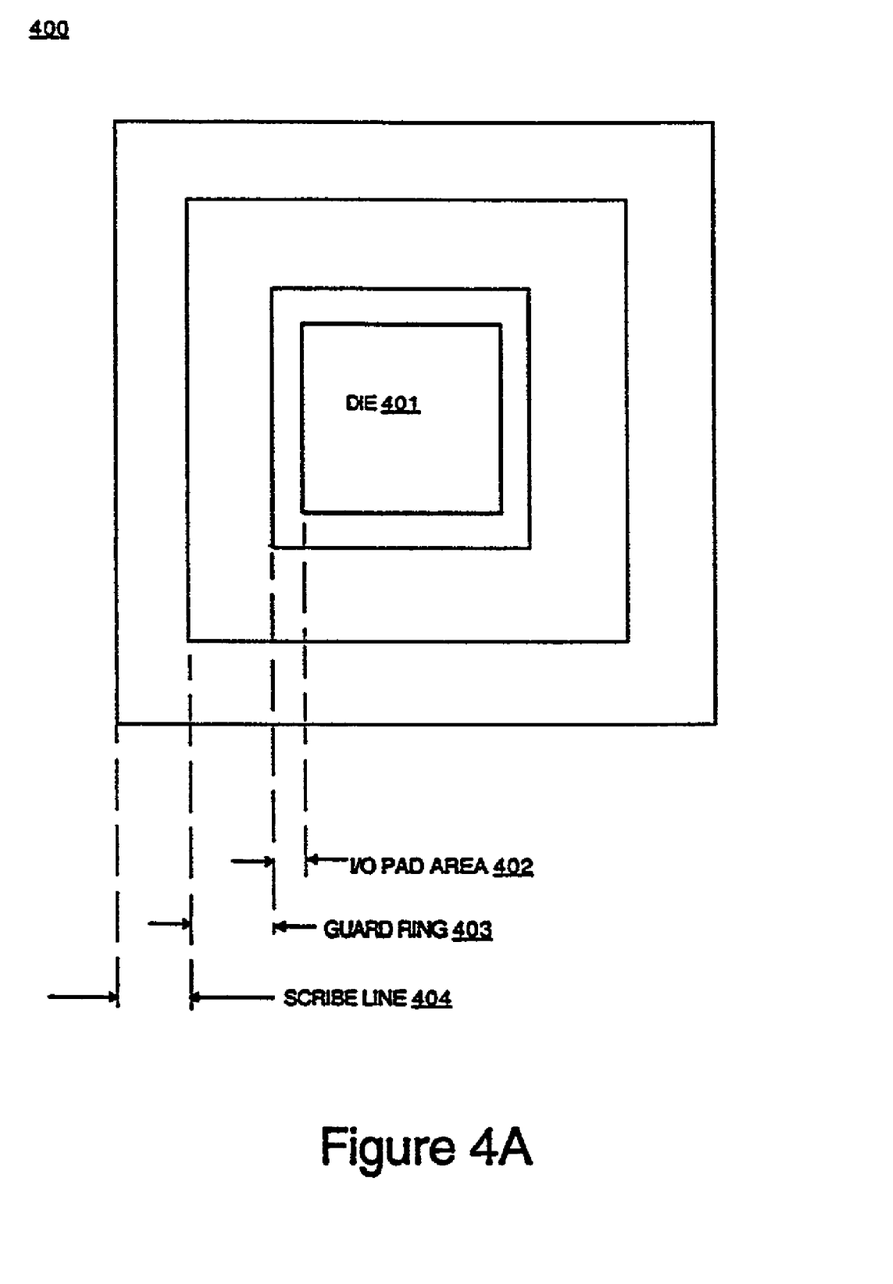
FIG. 4A shows the general layout of a integrated circuit die in accordance with one embodiment of the present invention.

FIG. 4A shows the general layout of a single integrated circuit die element 400 on a wafer (e.g., wafer 206 of FIG. 3). Although die element 400 is illustrated as square-shaped, it is appreciated that die element 400 may be rectangular-shaped. Die element 400 comprises integrated circuit die 401, which is surrounded by an input/output (I/O) pad area 402, a guard ring 403, and a scribe line 404. The scribe line 404 contains inserts and production marks (e.g., the alignment marks of FIG. 4B or 4C) used during the manufacture of integrated circuit dies from a wafer. When die element 400 is stepped around the wafer 206 during manufacture, the scribe line 404 is overlaid from side to side and from top to bottom. That is, a segment of the scribe line in one stepper shot is overlaid by a segment of the scribe line of the adjoining stepper shot. For example, the right-hand portion of a scribe line of a first stepper shot is overlaid by the left-hand portion of a scribe line of the adjoining stepper shot.

Figure 4B:
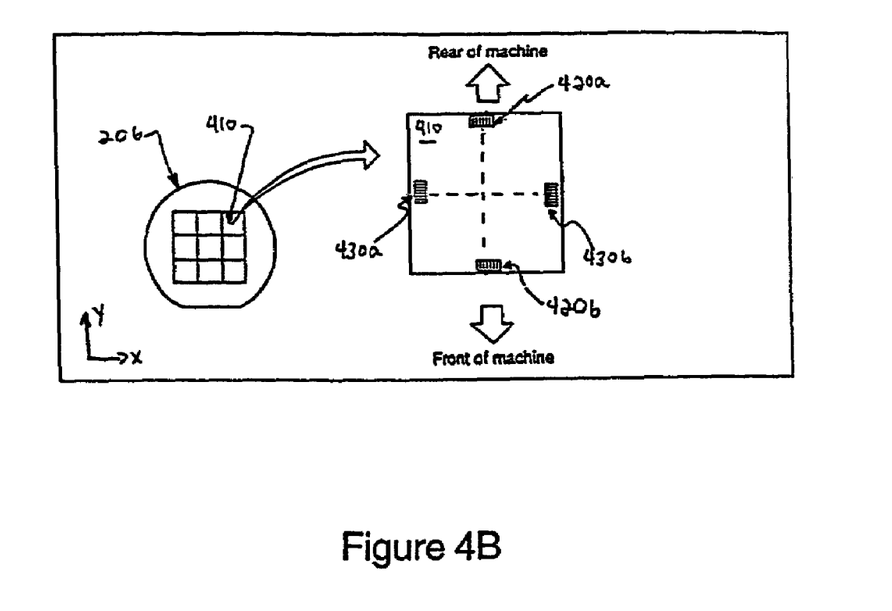
FIG. 4B shows an arrangement of alignment targets according to one embodiment of the present invention.

FIG. 4B shows an arrangement of alignment targets 420a, 420b, 430a and 430b in a stepper shot 410 on a wafer 206 according to one embodiment of the present invention. Although stepper shot 410 is illustrated as square-shaped, it is appreciated that stepper shot 410 may be rectangular-shaped. Alignment targets 420a, 420b, 430a and 430b are disposed within the scribe line of stepper shot 410 (e.g., scribe line 404 of FIG. 4A). It will be understood by a person of ordinary skill in the art that the arrangement of alignment targets illustrated by FIG. 4B also corresponds to a target pattern on a reticle used to form alignment targets 420a, 420b, 430a and 430b on wafer 206 in stepper shot 410.

With reference to FIG. 4B, alignment targets 420a and 420b are on opposite sides of stepper shot 410 and are positioned in mirror-image locations. In the present embodiment, alignment targets 420a and 420b are located at the mid-point of opposite sides of stepper shot 410. Similarly, alignment targets 430a and 430b are positioned in mirror-image locations on the other two opposite sides of stepper shot 410. In the present embodiment, alignment targets 430a and 430b are located at the mid-point of opposite sides of stepper shot 410. It is appreciated that, in other embodiments, alignment targets 420a, 420b, 430a and 430b can be positioned at other than the mid-points of the sides of stepper shot 410, as long as alignment targets 420a and 420b are in mirror-image positions on opposite sides, and alignment targets 430a and 430b are in mirror-image positions on the other two opposite sides.

Figure 4C:
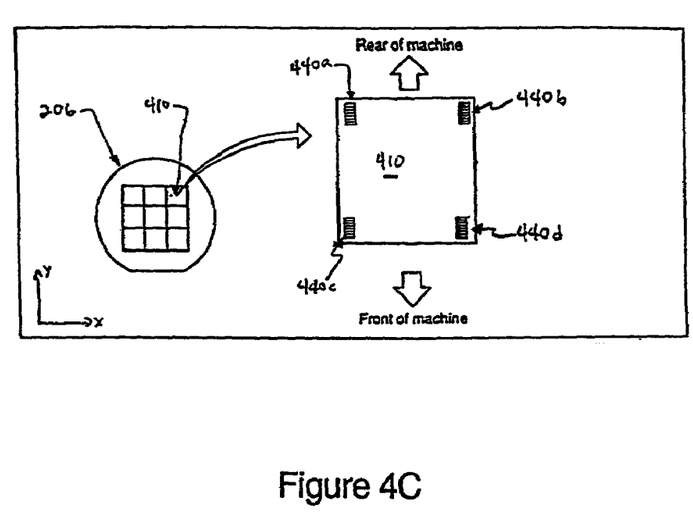
FIG. 4C shows an arrangement of alignment targets according to another embodiment of the present invention.

FIG. 4C shows an arrangement of alignment targets 440a, 440b, 440c and 440d according to another embodiment of the present invention. In this embodiment, alignment targets 440a, 440b, 440c and 440d are located at the corners of stepper shot 410.

With reference to FIGS. 4A, 4B and 4C, when die element 400 is stepped around wafer 206, the scribe lines 404 for each stepper shot 410 are overlaid by an adjoining stepper shot, as described above. Accordingly, the alignment targets in the scribe lines 404 will also be overlaid by an alignment target of an adjoining stepper shot. For example, alignment target 430b in a first stepper shot will be overlaid by alignment target 430a in a subsequent stepper shot adjoining, and to the right of, the first stepper shot.

As will be seen, the use of four alignment targets, and their arrangement in mirror-image positions in the scribe line of a stepper shot, provides an efficient and precise method and system for segregating and compensating for rotational error (refer to FIGS. 6A through 6C, below). In addition, the use of four alignment targets per stepper shot will increase the precision of the alignment process. Furthermore, with four alignment targets arranged as described for the present invention, lens distortion error may be averaged out or reduced.

Figure 5:
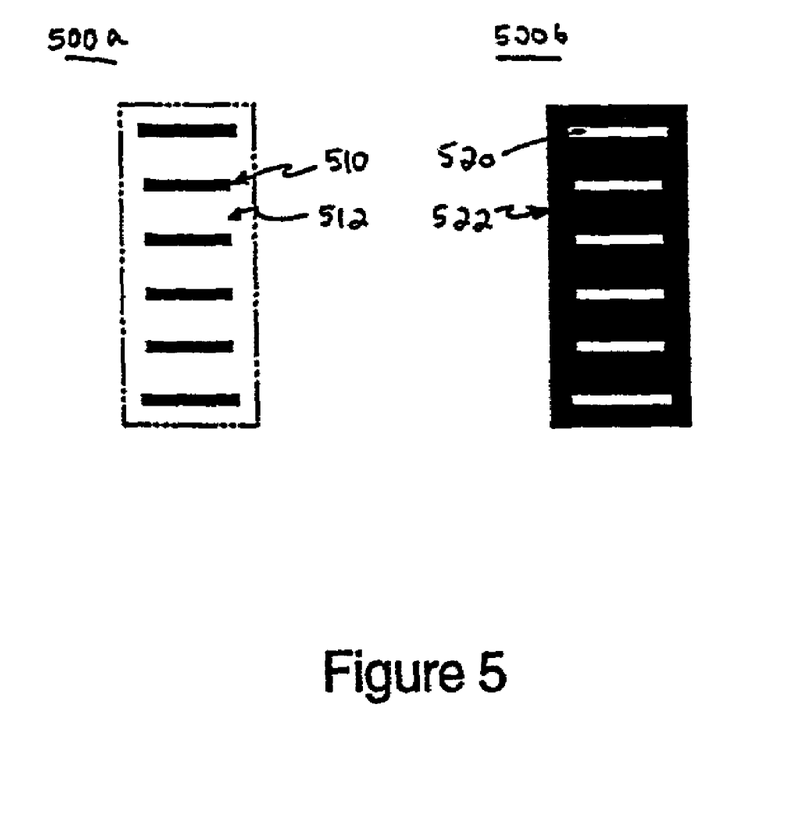
FIG. 5 shows target patterns in an alignment target in accordance with one embodiment of the present invention.

FIG. 5 shows target patterns 500a and 500b in an alignment target (e.g., the targets of FIGS. 4B and 4C) in accordance with one embodiment of the present invention. The target pattern 500a comprises a plurality of solid (typically, chrome) rectangles 510 in a clear field 512. The target pattern 500b comprises a plurality of clear rectangles 520 in a solid (typically, chrome) background 522. The target patterns 500a and 500b are formed using a known positive or negative photoresist process.

Although six rectangles are shown in each of target patterns 500a and 500b, it is understood that any number of such rectangles can be used in accordance with the present invention. Furthermore, other types of target patterns and designs can be used in accordance with the present invention; one such design is described in U.S. Pat. No. 5,316,984 by P. Leroux and assigned to the assignee of the present invention, and which is hereby incorporated by reference. It is also understood that the target patterns of FIG. 5 correspond to target patterns on a reticle that is used to form target patterns 500a and 500b on wafer 206 in stepper shot 410 (FIGS. 4B and 4C).

Continuing with reference to FIG. 5, the dimensions of rectangles 510 and 520 are precisely specified. Typically, the rectangles 510 and 520 have a width of four (4) microns and a length of 30 microns. However, these dimensions are not critical to the present invention, and different dimensions can be used.

Figure 6A:
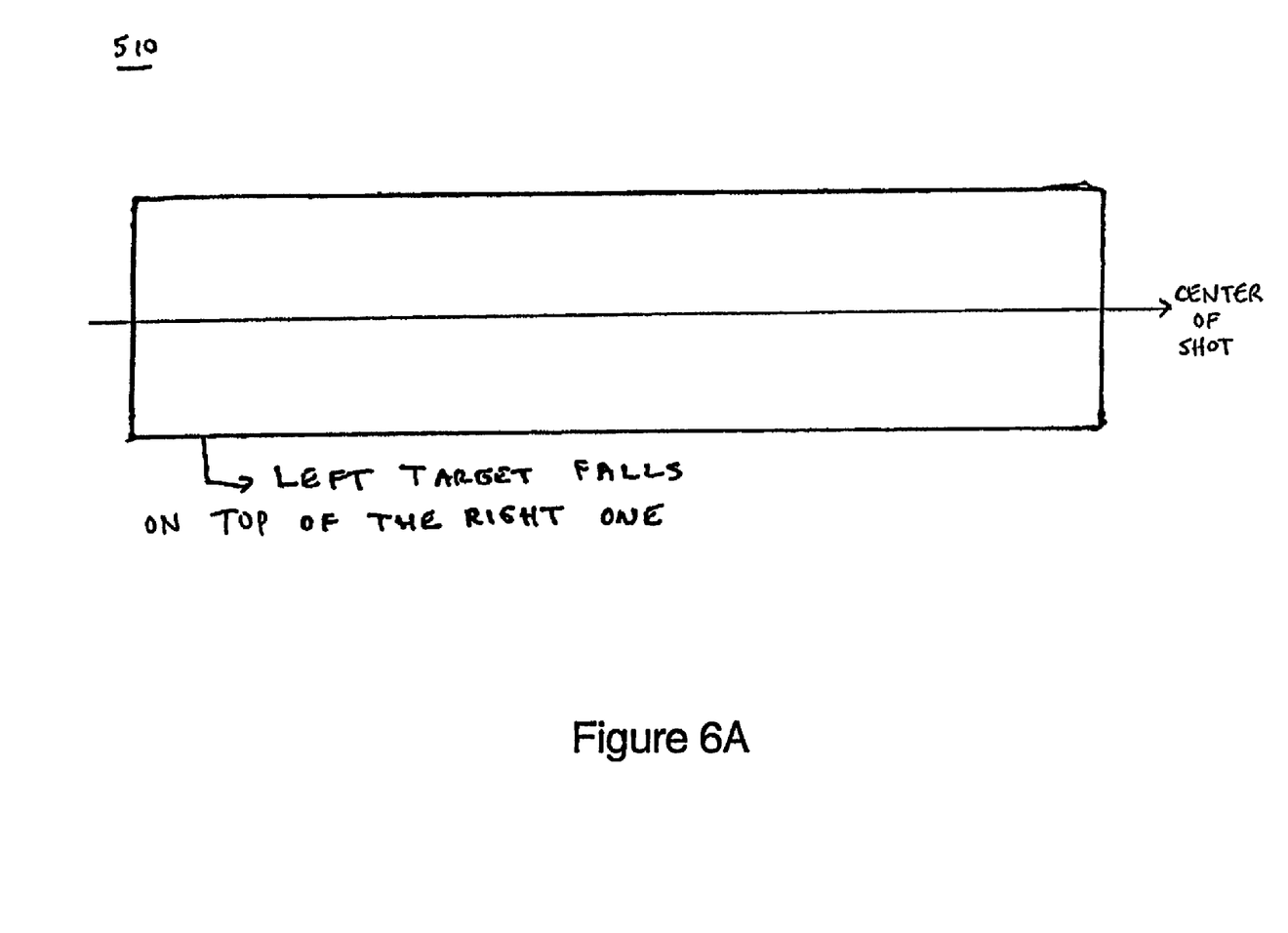
FIG. 6A illustrates a target mark in an alignment target with no rotational error in accordance with one embodiment of the present invention.

In accordance with one embodiment of the present invention, FIG. 6A illustrates the alignment of a target mark (e.g., a rectangle 510) in an alignment target (e.g., the alignment targets of FIGS. 4B and 4C) for the case where there is no rotational error. Recall that, in accordance with the present invention, the alignment target of one stepper shot will be overlaid by the alignment target of a subsequent, adjoining stepper shot; for example, alignment target 430b in a first stepper shot will be overlaid by alignment target 430a in a subsequent stepper shot adjoining, and to the right of, the first stepper shot. For the purposes of the discussion herein, the alignment target formed as a result of the overlay of alignment targets will be referred to as the "overlay target" or the "resultant target."

For the case in which there is no rotational error, the target marks (e.g., rectangles 510) of alignment target 430a (from the second stepper shot) and the target marks of alignment target 430b (from the first stepper shot) will precisely align. As a result, there will be no change in the specified dimensions of each rectangle 510 in the overlay target (e.g., each rectangle 510 will still measure 4 microns by 30 microns). Consequently, the center (centroid) of each rectangle 510 in the overlay target is unchanged, and the centroid of the overlay target is also unchanged.

Thus, in accordance with the present invention, when the dimensions of the rectangles 510 in the overlay target are unchanged, this provides an indication that there is no rotational error. Conversely, when alignment target 430b (from the first stepper shot) and alignment target 430a (from the second stepper shot) align, this also provides an indication that there is no rotational error. As such, measurements and calculations needed to determine rotational error are not necessary, saving both fabrication time and processing time and potentially increasing the throughput of the stepper.

Figure 6B:
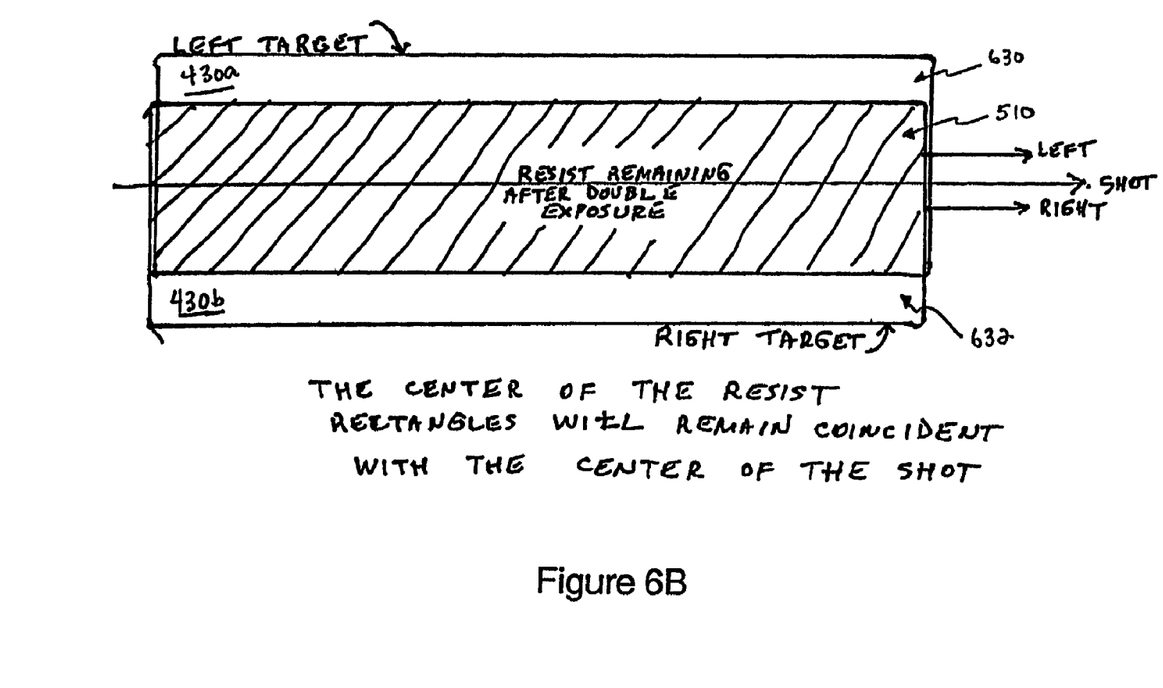
FIG. 6B illustrates a target mark in an alignment target with clockwise rotation about the center of a stepper shot in accordance with one embodiment of the present invention.

FIG. 6B illustrates a target mark (e.g., rectangle 510) in an alignment target (e.g., the alignment targets of FIGS. 4B and 4C) for the case in which there is clockwise rotation about the center of each stepper shot, in accordance with one embodiment of the present invention. FIG. 6B can also illustrate the case in which a first stepper shot is properly aligned (no rotational error) and a second, adjoining stepper shot is rotated about its center. As a result in either case, the alignment target 430a of the second stepper shot will not precisely align with the alignment target 430b of the first stepper shot. Consequently, a target mark (e.g., rectangle 630) of alignment target 430a (of the second stepper shot) will not align with a target mark (e.g., rectangle 632) of alignment target 430b (of the first stepper shot).

According to the positive photoresist process, the rectangle 510 resulting from the overlay of rectangles 630 and 632 will be formed. Accordingly, rectangle 510 of the overlay target will have reduced dimensions (that is, its width will be something less than 4 microns, depending on the amount of rotation). However, for the case in which the rotation occurs about the center of a stepper shot, the center (centroid) of rectangle 510 will not change, and thus the centroid of the overlay target is also unchanged. Note that, for the negative resist process, the rectangle 510 resulting from the overlay of rectangles 630 and 632 will have increased dimensions (that is, its width will be something more than 4 microns, depending on the amount of rotation).

Therefore, in accordance with the present invention, when there is rotation about the center of a stepper shot, the effect of the rotation is canceled out because the centroid of the overlay target is unchanged. That is, the centroid of each resultant rectangle 510 in the overlay target, and hence the centroid of the overlay target, remains coincident with the center of the stepper shot. Accordingly, the rotation of the stepper shot can be compensated for by finding the centroid of the overlay target, as if there was no rotation. As such, measurements and calculations needed to determine rotational error are not necessary, saving both fabrication time and processing time and potentially increasing the throughput of the stepper.

Figure 6C:
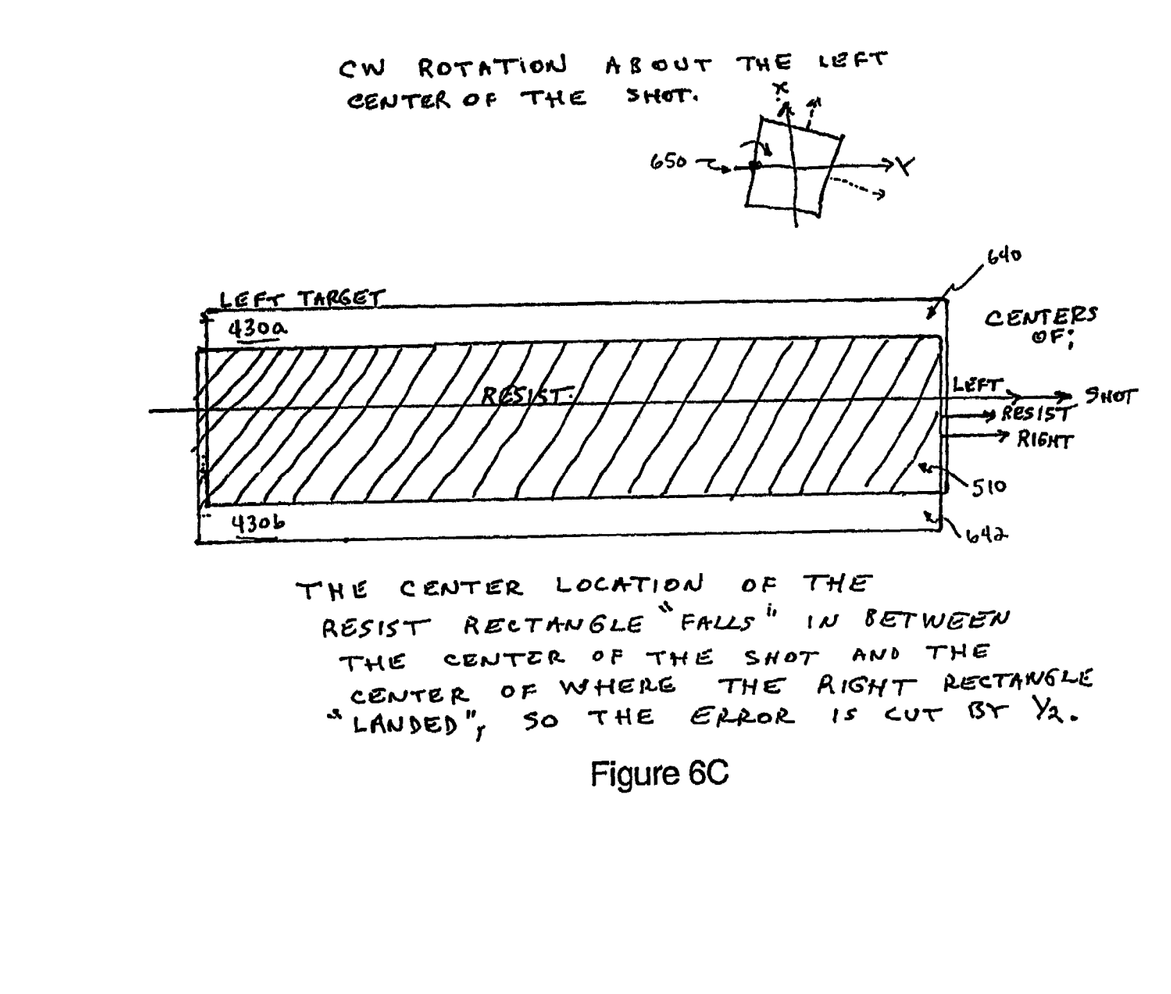
FIG. 6C illustrates a target mark in an alignment target with clockwise rotation about the left-center of a stepper shot in accordance with one embodiment of the present invention.

FIG. 6C illustrates a target mark (e.g., rectangle 510) in an alignment target (e.g., the alignment targets of FIGS. 4B and 4C) for the case in which there is clockwise rotation about the center of one side of each stepper shot, in accordance with one embodiment of the present invention. FIG. 6C can illustrate the case in which, for example, a first stepper shot is properly aligned (no rotational error) and a second, adjoining stepper shot is rotated about its left-center. As a result in either case, the alignment target 430a of the second stepper shot will not precisely align with the alignment target 430b of the first stepper shot. Consequently, a target mark (e.g., rectangle 640) of alignment target 430a (of the second stepper shot) will not align with a target mark (e.g., rectangle 642) of alignment target 430b (of the first stepper shot).

According to the positive photoresist process, the rectangle 510 resulting from the overlay of rectangles 640 and 642 will be formed. Accordingly, rectangle 510 of the overlay target will have reduced dimensions (that is, its width will be something less than 4 microns, depending on the amount of rotation). Note that, for the negative resist process, the rectangle 510 resulting from the overlay of rectangles 630 and 632 will have increased dimensions (that is, its width will be something more than 4 microns, depending on the amount of rotation).

In this case, where a stepper shot is rotated about the center of one of its sides, the centroid of each resultant rectangle 510 in the overlay target will be different from the center of the stepper shot, and hence the centroid of the overlay target will be different from the center of the stepper shot. Thus, there may be a need to measure and compensate for the rotational error for this type of rotation. However, in general, rotation about the center of one side of the stepper shot does not occur as frequently as rotation about the center of the stepper shot. Moreover, in accordance with the present invention, the magnitude of the rotational error is reduced by one-half. Accordingly, the rotational error of this type may not consume a significant portion of the overlay budget. As such, in a greater number of instances relative to the prior art, it may be permissible to neglect the rotational error, and thus stepper performance will not be adversely affected and can be potentially improved.

Therefore, in accordance with the present invention, when there is rotation about the center of a stepper shot, the effect of the rotation is canceled out because the centroid of the overlay target is unchanged. That is, the centroid of each resultant rectangle 510, and hence the centroid of the overlay target, remains coincident with the center of the stepper shot. As such, measurements and calculations needed to determine rotational error are not necessary, saving both fabrication time and processing time and potentially increasing the throughput of the stepper. In other instances, when rotation occurs about the center of one side of a stepper shot, the magnitude of the rotational error is reduced and therefore may not be a significant portion of the overlay budget requirement.

Figure 7:
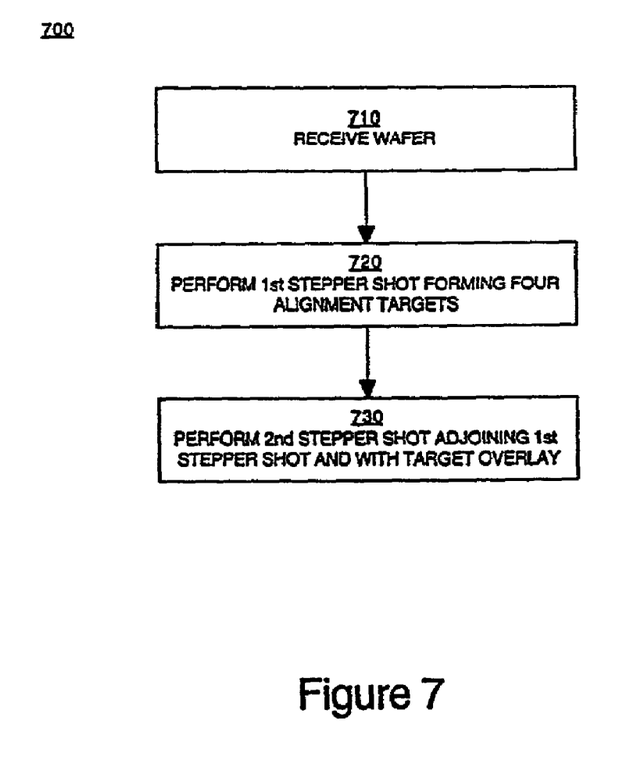
FIG. 7 is a flowchart of the steps in a process for forming alignment targets on a wafer in accordance with one embodiment of the present invention.

FIG. 7 is a flowchart of the steps in a process 700 for forming alignment targets (e.g., the alignment targets of FIGS. 4B and 4C) on a wafer 206 (FIGS. 4B and 4C) in accordance with one embodiment of the present invention. Many of the instructions for the steps, and the data input and output from the steps, of process 700 utilize memory and utilize controller hardware shown in FIG. 3. For example, wafer 206, stage 208, and signal transceiver 204, can be controlled by memory 214 and processor 212 to accomplish the requirements steps in process 700. Alternative embodiments of FIG. 3 are equally applicable to implementing the steps of process 700. Furthermore, while in the present embodiment process 700 is utilized in a stepper machine, the present invention is well-suited to other devices needing wafer alignment. In the present embodiment, software in memory 214 does not need to be modified for process 700.

While process 700 of the present embodiment shows a specific sequence and quantity of steps, the present invention is suitable to alternative embodiments. For example, the present invention is well-suited to an embodiment which includes more or less steps than process 700. Likewise, the sequence of the steps can be modified depending upon the application. Furthermore, while process 700 is shown as a single serial process, it can also be implemented as a continuous or parallel process.

In step 710 of FIG. 7, a wafer 206 is received at stepper 202 (FIG. 3).

In step 720 of FIG. 7, with reference also to FIGS. 4A, 4B and 4C, a first stepper shot 410 is performed. In accordance with the present invention, four alignment targets are formed in scribe line 404 of stepper shot 410. In one embodiment, the four alignment targets are positioned as shown by FIG. 4B; that is, alignment targets 420a and 420b are located in mirror-image positions on opposite sides of stepper shot 410, and alignment targets 430a and 430b are similarly located. In another embodiment, the four alignment targets 440a–b are positioned as shown in FIG. 4C.

In step 730 of FIG. 7, with reference as well to FIGS. 4A, 4B and 4C, a second stepper shot 410 with four alignment targets is performed. A segment of scribe line 404 of the second stepper shot overlays a segment of scribe line 404 of the first stepper shot, such that an alignment target of the second stepper shot overlays an alignment target of the first stepper shot. For example, the left-hand portion of scribe line 404 of the second stepper shot can overlap the right-hand portion of scribe line 404 of the first stepper shot, in which case alignment target 430a of the second stepper shot would overlay alignment target 430b of the first stepper shot.

In accordance with the present invention, if there is no rotation of the stepper shots, then alignment target 430b (of the second stepper shot) would precisely align with alignment target 430a (of the first stepper shot).

If there is rotation of one or both of the stepper shots about their centers, then alignment target 430b (of the second stepper shot) will not precisely align with alignment target 430a (of the first stepper shot); however, the centroid of the overlay target formed as a result of the overlay will still indicate the center of the shot. Accordingly, there is not a need to measure or calculate the magnitude of the rotational error, and the rotation of the second stepper shot can be compensated for by finding the centroid of the overlay target.

If there is rotation of one or both of the stepper shots about the centers of one of their sides, then alignment target 430b (of the second stepper shot) will not precisely align with alignment target 430a (of the first stepper shot). In this case, the centroid of the overlay target formed as a result of the overlay will be different from the center of the shot due to rotational error; however, the magnitude of the rotational error will be reduced by one-half relative to conventional methods.

Figure 8:
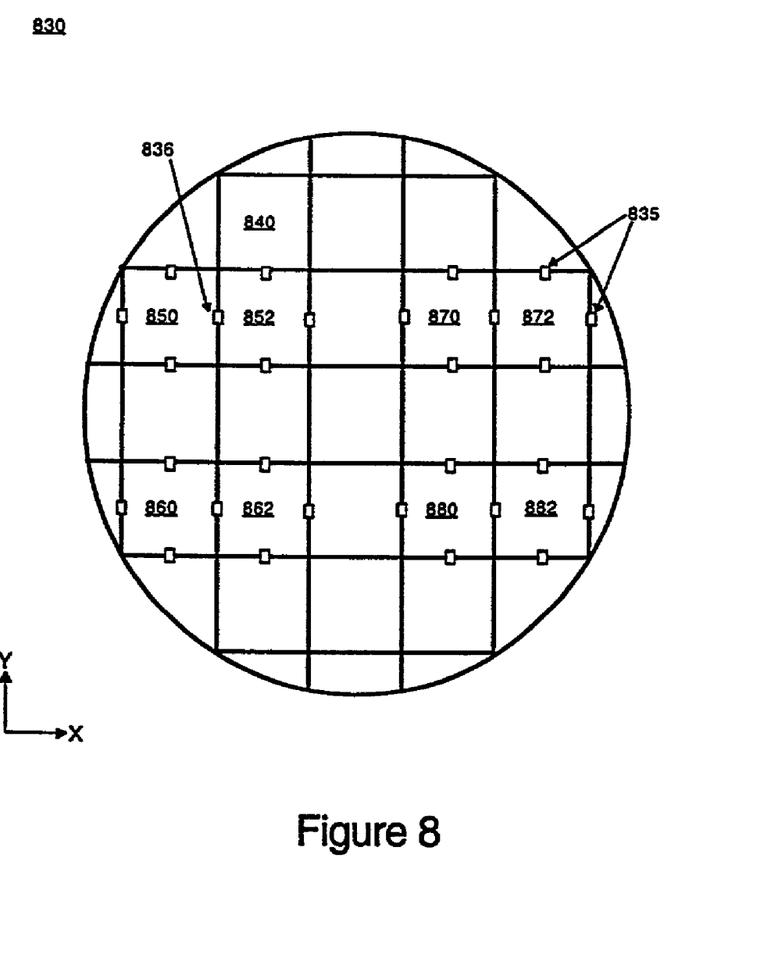
FIG. 8 illustrates a top perspective view of a wafer with alignment targets in accordance with one embodiment of the present invention.

FIG. 8 illustrates a top perspective view of a wafer 830 with a multiplicity of alignment targets 835 in accordance with one embodiment of the present invention. Wafer 830 is partitioned into a number of shots exemplified by shot 840. In FIG. 8, for illustration purposes, shots 850, 852, 860, 862, 870, 872, 880 and 882 have four alignment targets 835 located at the mid-point of each their sides, as described in conjunction with FIG. 4B, above. However, it is appreciated that each shot 840 can have four alignment targets 835 in accordance with the present invention.

With reference still to FIG. 8, considering only adjacent shots 850 and 852 by way of example, alignment target 836 is located at the right-hand side of shot 850 and the left-hand side of shot 852. As described above, alignment target 836 is formed by overlapping the left-hand target of shot 852 and the right-hand target of shot 850. Thus, alignment target 836 is actually the composite of targets formed in two different shots.

In general, when aligning the stepper and the wafer, a certain number of shots are selected for the alignment. Typically, eight shots may be selected for alignment. However, in accordance with the present invention, adjacent shots share alignment targets, as described previously herein. Correspondingly, a target such as alignment target 836 in effect represents two shots (e.g., shots 850 and 852). As such, in accordance with the present invention, the number of shots selected for alignment can be reduced by one-half while still maintaining the current level of precision. On the other hand, the precision can be increased two-fold if the number of shots selected for alignment is not reduced. Thus, another advantage to the present invention is that it can advantageously increase throughput without loss of precision, or increase precision without loss of throughput.

The present invention thus provides a method and system thereof that can properly compensate for rotational error in the integrated circuit fabrication process. The present invention also provides a method and system that can save measurement and processing time, thereby potentially improving stepper throughput.

The preferred embodiment of the present invention, a self-compensating mark design for stepper alignment, is thus described. While the present invention has been described in particular embodiments, it should be appreciated that the present invention should not be construed as limited by such embodiments, but rather construed according to the following claims.

What is claimed is:

1. A wafer for fabricating integrated circuits using a stepper, said wafer comprising:
    a first region of the wafer, the first region having four sides and having a scribe line along each of the four sides of the first region; and
    four alignment targets each having a rectangular shape disposed within said scribe line;
    wherein one alignment target is located on each of the four sides of the first region wherein a first alignment target on a first side of the first region and a second alignment target on a second side of the first region opposing said first side are located in mirror-image positions, and further including a rectangular overlay target which has a width that corresponds to a stepper rotational error between the first region and an adjacent second region of the wafer.

2. The wafer as recited in claim 1 wherein opposing sides of the first region are equal in length, and wherein an alignment target is located at each mid-point of a side of first region.

3. The wafer as recited in claim 1 wherein an alignment target is located at each corner of the first region.

4. The wafer as recited in claim 1 wherein said alignment targets are formed according to a positive resist process.

5. The wafer as recited in claim 1 wherein said alignment targets are formed according to a negative resist process.

6. The wafer as recited in claim 1 wherein each of said alignment targets comprise a plurality of rectangles.

7. A semiconductor structure, comprising:

a wafer;

a plurality of four-sided integrated circuit regions, separated by scribe lines disposed on a first surface of the wafer; and at least one alignment target having a rectangular shape disposed in a first scribe line, the first scribe line being a common region between a first stepper shot and a second stepper shot;

wherein the second stepper shot overlays a rectangular alignment target on the at least one alignment target disposed in the first scribe line and the resulting rectangular overlay target has a width that corresponds to a stepper rotational error between the first stepper shot and the second stepper shot.

* * * * *